(12) United States Patent
Kobayashi et al.

(10) Patent No.: US 9,924,590 B2
(45) Date of Patent: Mar. 20, 2018

(54) PRINTED BOARD AND ELECTRONIC APPARATUS

(71) Applicants: Tomoyoshi Kobayashi, Aichi (JP); Masato Kasashima, Gifu (JP)

(72) Inventors: Tomoyoshi Kobayashi, Aichi (JP); Masato Kasashima, Gifu (JP)

(73) Assignee: OMRON AUTOMOTIVE ELECTRONICS CO., LTD., Aichi (JP)

( * ) Notice: Subject to any disclaimer, the term of this patent is extended or adjusted under 35 U.S.C. 154(b) by 63 days.

(21) Appl. No.: 15/159,393

(22) Filed: May 19, 2016

(65) Prior Publication Data

US 2016/0345424 A1 Nov. 24, 2016

(30) Foreign Application Priority Data

May 19, 2015 (JP) ................................. 2015-101548

(51) Int. Cl.
*H05K 1/02* (2006.01)
*H05K 1/05* (2006.01)
*H05K 1/11* (2006.01)
*H05K 1/18* (2006.01)
(Continued)

(52) U.S. Cl.
CPC ......... *H05K 1/0204* (2013.01); *H05K 1/0271* (2013.01); *H05K 3/0061* (2013.01);
(Continued)

(58) Field of Classification Search
CPC .... H05K 1/0203; H05K 1/115; H05K 1/0298; H05K 1/056; H05K 1/181;
(Continued)

(56) References Cited

U.S. PATENT DOCUMENTS 6,324,067 B1 * 11/2001 Nishiyama ............ H05K 1/165
174/262
7,121,000 B2 10/2006 Kawashima et al.
(Continued)

FOREIGN PATENT DOCUMENTS

JP 2003-017862 A 1/2003
JP 2010-205995 A 9/2010
(Continued)

*Primary Examiner* — Robert J Hoffberg
*Assistant Examiner* — Matt Dhillon
(74) *Attorney, Agent, or Firm* — Osha Liang LLP

(57) ABSTRACT

A printed board includes: a base member; a recess portion provided in the base member; a heat dissipation member fitted into the recess portion; and a wiring pattern provided on an upper side of the base member and the heat dissipation member via an insulator. A contact portion in which an inner circumferential surface of the recess portion and an outer circumferential surface of the heat dissipation member contact each other and a separation portion in which those do contact each other are formed. A gap between the recess portion and the heat dissipation member is filled with thermosetting resin of the base member melted by heating. At least a partial portion in a width direction of the wiring pattern passes through a position vertically overlapping the separation portion while an entire portion thereof does not pass through a position vertically overlapping the contact portion.

7 Claims, 11 Drawing Sheets

(51) Int. Cl.
  *H05K 3/00* (2006.01)
  *H05K 3/46* (2006.01)
(52) U.S. Cl.
  CPC ......... *H05K 3/4623* (2013.01); *H05K 3/4697* (2013.01); *H05K 2201/0129* (2013.01); *H05K 2201/0187* (2013.01); *H05K 2201/09036* (2013.01); *H05K 2201/09145* (2013.01); *H05K 2201/09227* (2013.01); *H05K 2201/09854* (2013.01); *H05K 2201/10166* (2013.01); *H05K 2201/10416* (2013.01); *H05K 2203/063* (2013.01)
(58) Field of Classification Search
  CPC . H05K 2201/10166; H05K 2201/0129; H05K 2201/066
  See application file for complete search history.

(56) References Cited

U.S. PATENT DOCUMENTS

| | | | | |
|---|---|---|---|---|
| 7,309,838 | B2* | 12/2007 | Noguchi | H01L 23/3672 174/255 |
| 8,378,229 | B2* | 2/2013 | Nakasato | H01L 21/486 174/262 |
| 9,497,853 | B2* | 11/2016 | Lee | H05K 3/4647 |
| 2001/0026441 | A1* | 10/2001 | Nakamura | H01L 23/3677 361/720 |
| 2003/0058630 | A1* | 3/2003 | Takano | H01L 23/10 361/783 |
| 2009/0038826 | A1* | 2/2009 | Lee | H05K 1/0206 174/252 |
| 2013/0092421 | A1* | 4/2013 | Kajiya | H05K 1/0206 174/252 |
| 2013/0347051 | A1* | 12/2013 | Bose | H04N 21/418 725/151 |
| 2014/0217608 | A1* | 8/2014 | Takayama | H05K 3/32 257/774 |
| 2014/0268780 | A1* | 9/2014 | Wang | F21V 19/003 362/249.06 |
| 2015/0146379 | A1* | 5/2015 | Katz | H05K 1/0204 361/707 |
| 2016/0150642 | A1* | 5/2016 | Kajita | H05K 1/115 361/783 |

FOREIGN PATENT DOCUMENTS

| | | |
|---|---|---|
| JP | 2010-258260 A | 11/2010 |
| JP | 2014-157949 A | 8/2014 |

\* cited by examiner

A-A CROSS SECTION

<INNER LAYERS L2, L3, AND L4>

<LOWER SURFACE LAYER L5>

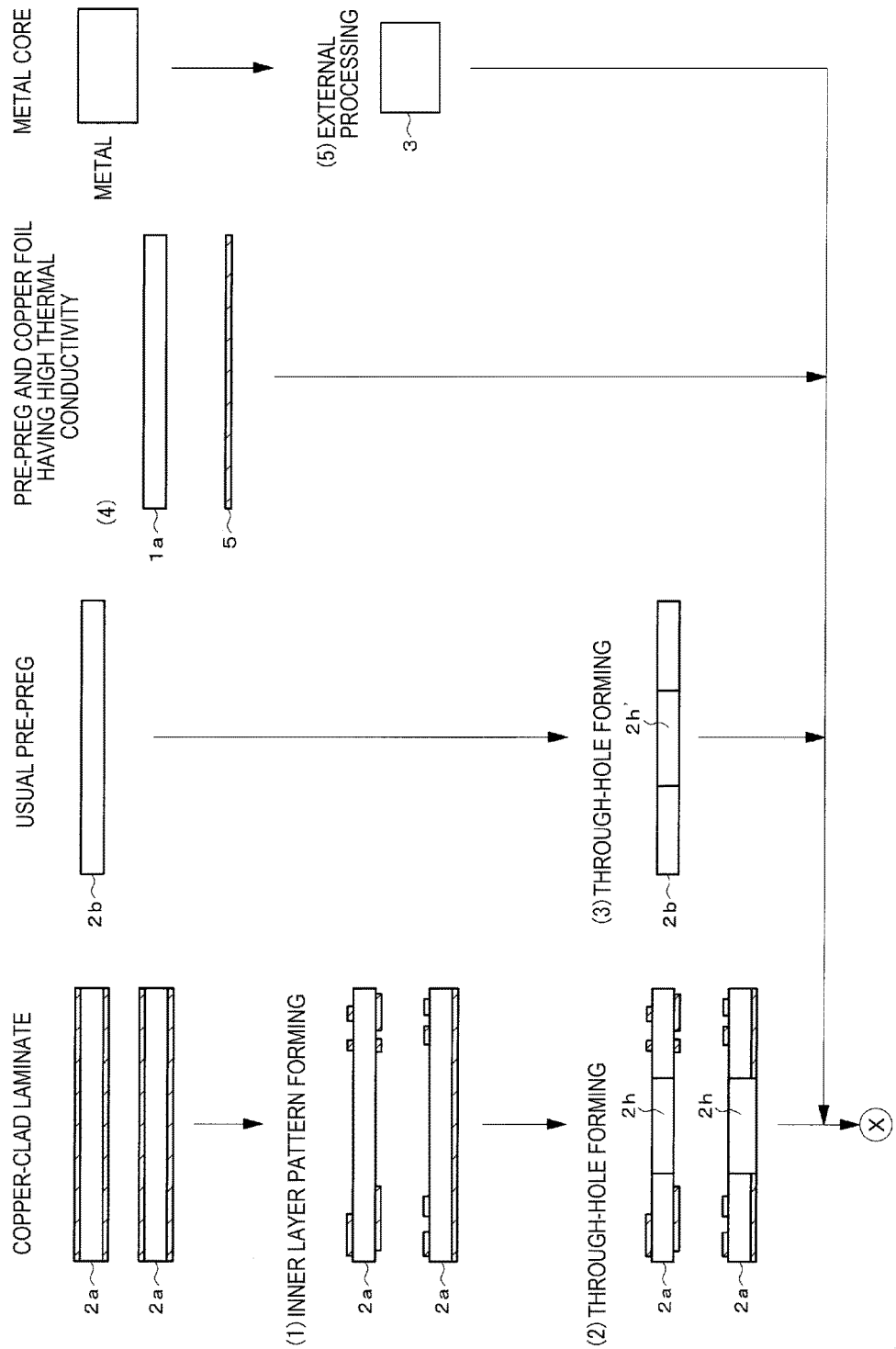

<UPPER SURFACE LAYER L1>

PRINTED BOARD AND ELECTRONIC APPARATUS

CROSS-REFERENCES TO RELATED APPLICATIONS

This application is based upon and claims the benefit of priority from Japanese Patent Application No. 2015-101548, filed on May 19, 2015; the entire contents of which are incorporated herein by reference.

FIELD

One or more embodiments of the present invention relate to a structure in which heat generated in electronic components mounted on a printed board is dissipated by a heat dissipation member embedded in the printed board.

BACKGROUND

Various methods have been proposed, in which a heat dissipation member is embedded in a printed board in order to dissipate heat generated in electronic components mounted on the printed board.

For example, in JP-A-2010-258260, an opening portion (through-hole) is provided on a position on the printed board where the electronic components are mounted, and the heat dissipation member (via conductor) of which the area is smaller than that of the opening portion is fitted into the opening portion. In addition, in an inner circumferential surface of the opening portion, a plurality of grooves is formed in a circumferential direction in a predetermined interval, and a plurality of protrusions engaging with each groove is formed on an outer circumferential surface of the heat dissipation member. Furthermore, a gap generated when the heat dissipation member is fitted into the opening portion is filled with a filling material made from an adhesive resin, and thus, the heat dissipation member is fixed to the printed board.

In addition, in JP-A-2010-205995, an opening portion (a through hole that passes through the printed board) is provided on a position on the printed board where the electronic components are mounted, a heat dissipation member (a metal piece) is inserted into the opening portion, and then, by deforming the heat dissipation member by pressurization, the heat dissipation member is fixed to the printed board and the height of the printed board and the height of the heat dissipation member become the same. In addition, protruding and recess portions are provided on the inner circumferential surface of the opening portion, and an apex of the protruding portion is made to be in contact with the heat dissipation member, and then, a gap between the opening portion and the heat dissipation member is filled with solder.

As in JP-A-2010-258260 and JP-A-2010-205995, when the protruding portion or the recess portion is provided on the inner circumferential surface of the opening portion or on the outer circumferential surface of the heat dissipation member, and the inner circumferential surface of the opening portion and the outer circumferential surface of the heat dissipation member are made to be in partial contact with each other, it is possible to prevent the heat dissipation member from getting out from the opening portion.

In addition, in JP-A-2014-157949, a through-hole provided on a lower base member is filled with a metal sheet or metal paste, a metal pattern is printed thereon, then, an upper base member is laminated and pressurized, and then, the metal base heat dissipation member (a heat-transfer member) is embedded into the base member. On the upper side of the heat dissipation member, a plurality of wiring patterns is provided via an insulator and electronic components are mounted on each wiring pattern.

As disclosed in JP-A-2014-157949, when a plurality of electronic components are mounted on the upper side of one heat dissipation member, it is possible to effectively dissipate the heat generated in the plurality of electronic components using the heat dissipation member and it is possible to improve a mounting density of the board.

On the other hand, in a multilayer printed board, for example, as disclosed in JP-A-2003-17862, an insulation layer and a conductive layer of the base member are formed from a double-sided wiring board and prepreg. By the prepreg being sandwiched between the plurality of double-sided wiring boards, and the plurality of double-sided wiring boards being heated and pressurized, a thermosetting resin contained in the prepreg is dissolved, and then, the thermosetting resin is cured. Then, the plurality of double-sided wiring boards and the prepreg are integrated.

SUMMARY

For example, in a printed board 50 in FIG. 13, when a through-hole 52h is formed on a base member 52 or when the heat dissipation member 56 is fitted into the through-hole 52h, as illustrated in FIG. 13A, a burr 53 may be generated on an edge of the through-hole 52h so as to protrude from a plate surface of the base member 52. Then, as illustrated in FIG. 13B, when an insulation layer 51 is provided on the base member 52 having the burr 53 and on the upper side of the heat dissipation member 56, and wiring patterns 54 and 55 are further provided on the insulation layer 51, the burr 53 collapses to some extent. However, sometimes, a part of the burr 53 rides on the heat dissipation member 56. In this case, the burr 53 remains at the boundary portion between the heat dissipation member 56 and the base member 52 in a mountain shape, and thus, a residual stress is generated around the burr 53. Then, when the printed board 50 is used by mounting electronic components on the upper portion of the wiring patterns 54 and 55, each portion is repeated to expand and shrink due to the heat generated in the electronic components or the change of the ambient temperature. Due to the expansion and the shrinking of each portion and the residual stress around the burr 53, as illustrated in FIG. 13C, there is a case where the insulation layer 51 is raised above the burr 53 and the wiring pattern 54 is disconnected. In a case where the wiring pattern 54 is completely disconnected, the electronic components mounted on the wiring pattern 54 cannot operate.

An object of one or more embodiments of the present invention is to prevent the disconnection of the wiring patterns on the upper side of the boundary portion between the heat dissipation member embedded in the printed board and the base member.

A printed board according to one or more embodiments of the present invention includes: a base member including a reinforcement member and a thermosetting resin, and formed in a plate shape; a recess portion provided on a lower surface of the base member; a heat dissipation member fitted into the recess portion; and wiring pattern provided on an upper side of the base member and the heat dissipation member via an insulator. Then, a contact portion in which an inner circumferential surface of the recess portion and an outer circumferential surface of the heat dissipation member are in contact with each other and a separation portion in which the inner circumferential surface of the recess portion and the outer circumferential surface of the heat dissipation member are not in contact with each other are formed in a state in which the heat dissipation member is fitted into the recess portion, a gap between the recess portion and the heat dissipation member is filled with the thermosetting resin of the base member melted by heating, and the wiring pattern is provided such that at least a partial portion in a width direction of the wiring pattern passes through a position vertically overlapping the separation portion while an entire portion in the width direction of the wiring pattern does not pass through a position vertically overlapping the contact portion.

According to one or more embodiments of the present invention, in a state in which the heat dissipation member is fitted into the recess portion provided on the base member of the printed board, the contact portion in which the inner circumferential surface of the recess portion and the outer circumferential surface of the heat dissipation member are in contact with each other and the separation portion in which those not in contact with each other are formed. In addition, the wiring patterns are provided such that the entire or a partial portion in the width direction of the wiring patterns pass through the position overlapping the separation portion while the entire portion in the width direction of the wiring patterns do not pass through the position overlapping the contact portion. Then, on the boundary portion between the heat dissipation member and the base member, even though a burr of the base member is generated on the contact portion so as to ride on the heat dissipation member, there is a concern that the residual stress may be generated around the burr, the burr of the base member is not generated on the separation portion so as to ride on the heat dissipation member, and thus, the residual stress is not generated due to the burr. Accordingly, by providing the wiring patterns such that at least a partial portion in the width direction of the wiring patterns pass through the position vertically overlapping the separation portion, it is possible to prevent the wiring patterns from being disconnected on the upper side of the boundary portion between the heat dissipation member and the base member.

In one or more embodiments of the present invention, in the printed board described above, a plurality of contact portions and separation portions may be respectively and alternately provided in a predetermined interval in a circumferential direction of the recess portion and the heat dissipation member.

In addition, according to one or more embodiments of the present invention, in the printed board described above, the contact portion may be formed by a protruding portion formed on the inner circumferential surface of the recess portion, and the separation portion may be formed by a portion other than the protruding portion on the inner circumferential surface of the recess portion.

In addition, according to one or more embodiments of the present invention, in the printed board described above, the base member may include a first insulation layer including the insulator on which the wiring pattern is provided on the upper surface, and a second insulation layer provided on a lower surface of the first insulation layer, the inner circumferential surface of the recess portion may be formed yb an inner circumferential surface of a through-hole formed in the second insulation layer, a bottom surface of the recess portion may be formed by the lower surface of the first insulation layer, and the wiring pattern may reach a position vertically overlapping the heat dissipation member from a position not vertically overlapping the heat dissipation member through the position where at least a partial portion in the width direction of the wiring pattern vertically overlaps the separation portion.

In addition, according to one or more embodiments of the present invention, in the printed board described above, the wiring patterns may be provided such that the entire portion in the width direction of the wiring patterns pass through the position vertically overlapping the separation portion.

In addition, an electronic apparatus according to one or more embodiments of the present invention includes the printed board described above and an electronic component mounted on the printed board on the position vertically overlapping the heat dissipation member.

In addition, according to one or more embodiments of the present invention, in the electronic apparatus described above, the heat dissipation member may be exposed from a lower surface of the printed board, and the electronic apparatus may further include an external heat dissipation body provided on a lower side of the printed board so as to be in contact with an exposed surface of the heat dissipation member.

According to one or more embodiments of the present invention, it is possible to prevent the disconnection of the wiring patterns on the upper portion of the boundary portion between the heat dissipation members embedded in the printed board and the base member.

BRIEF DESCRIPTION OF THE DRAWINGS

FIG. 6A is a diagram illustrating a manufacturing process of the printed board in FIG. 1;

DETAILED DESCRIPTION

In embodiments of the invention, numerous specific details are set forth in order to provide a thorough understanding of the invention. However, it will be apparent to one of ordinary skill in the art that the invention may be practiced without these specific details. In other instances, well-known features have not been described in detail to avoid obscuring the invention.

Hereinafter, embodiments of the present invention will be described with reference to the drawings. In each diagram, the same reference signs will be given to the same or corresponding elements.

First, structures of a printed board 10 and an electronic apparatus 100 in an embodiment will be described with reference to FIG. 1 to FIG. 5C.

Figure 1:
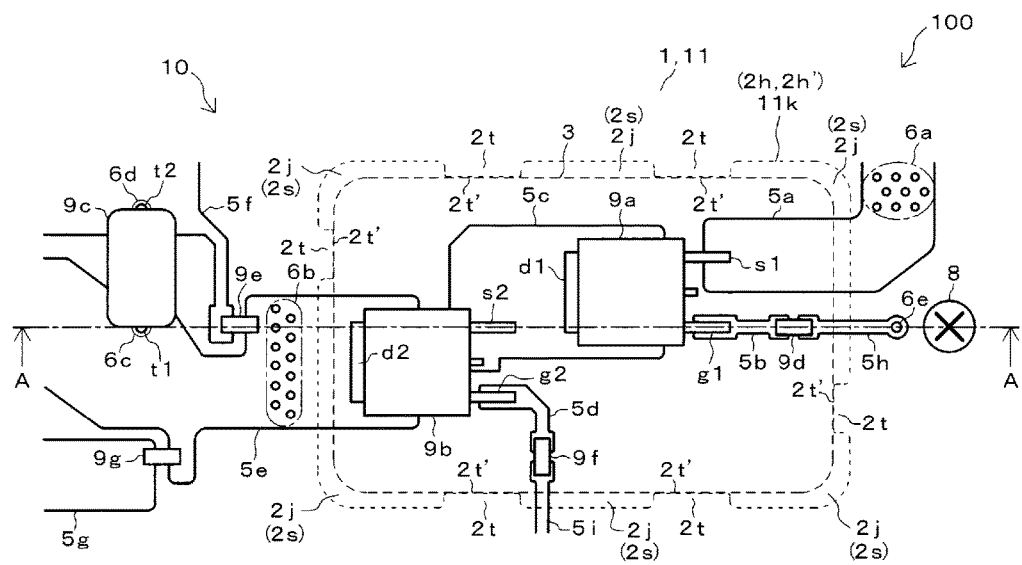
FIG. 1 is a diagram illustrating an upper surface layer of a printed board in an embodiment of the present invention.
Figure 2:
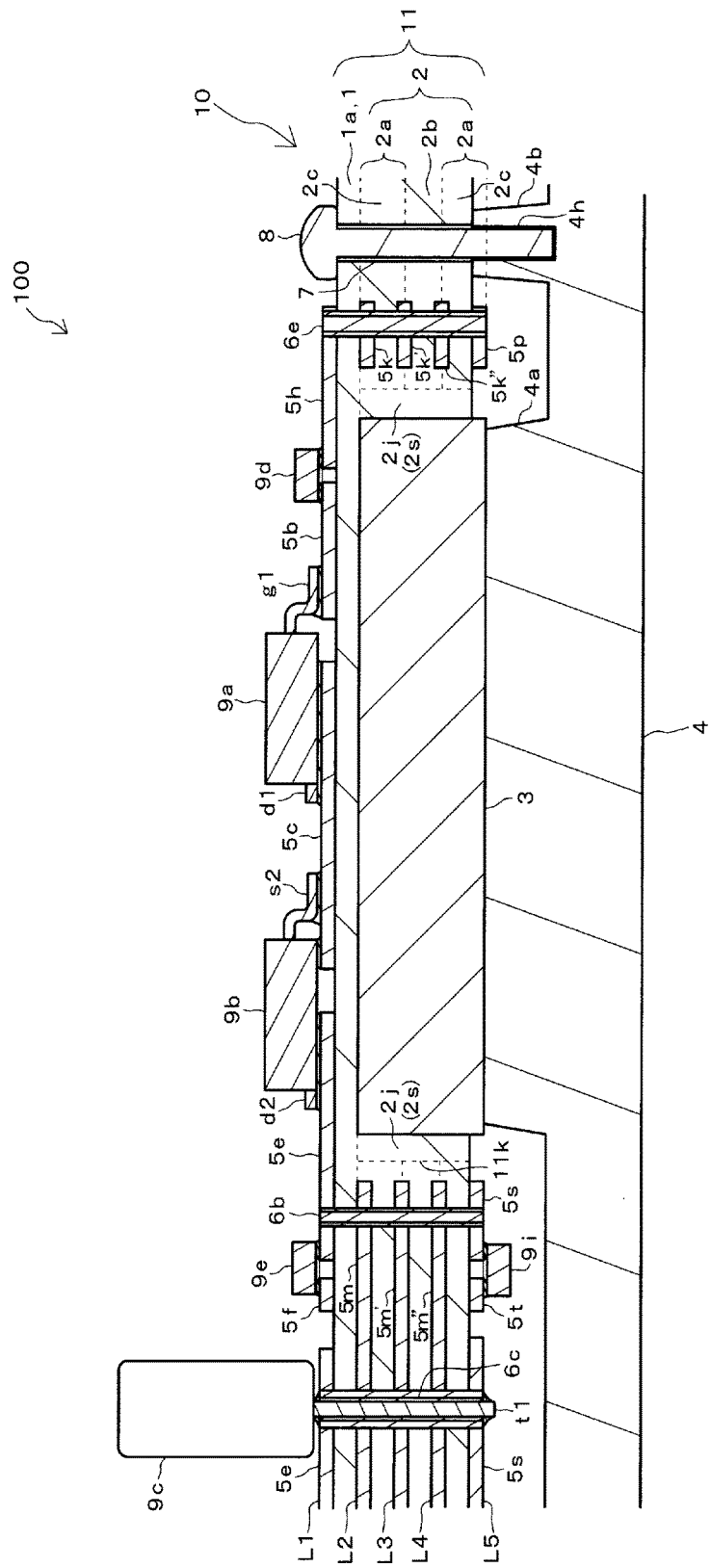
FIG. 2 is a diagram illustrating a cross section A-A in FIG. 1.
Figure 3:
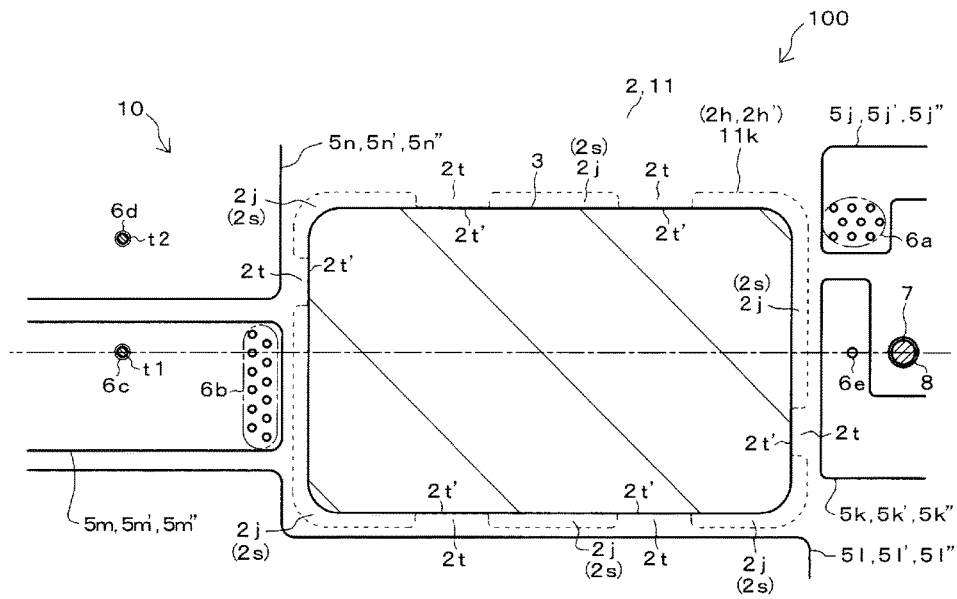
FIG. 3 is a diagram illustrating an internal layer of the printed board in FIG. 1.
Figure 4:
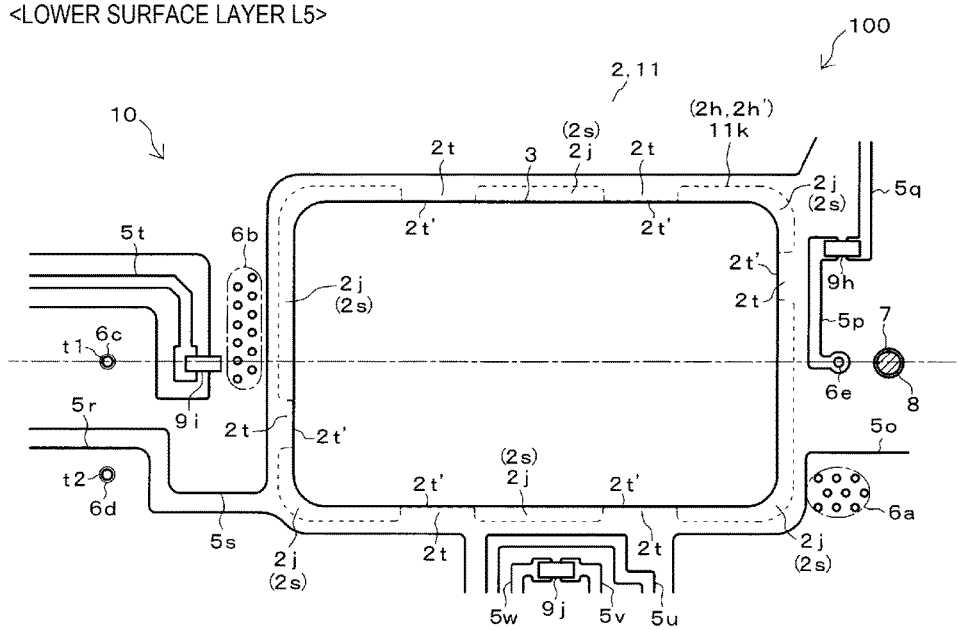
FIG. 4 is a diagram illustrating a lower surface layer of the printed board in FIG. 1.
Figure 5A:
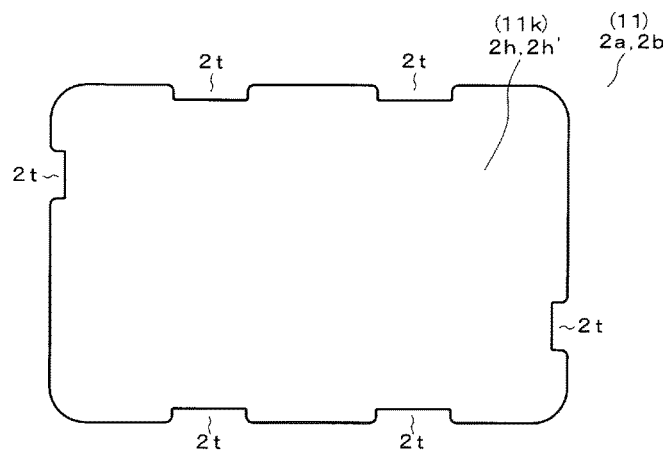
FIGS. 5A to 5C are diagrams illustrating a recess portion and a metal core provided on the printed board in FIG. 1.
Figure 5B:
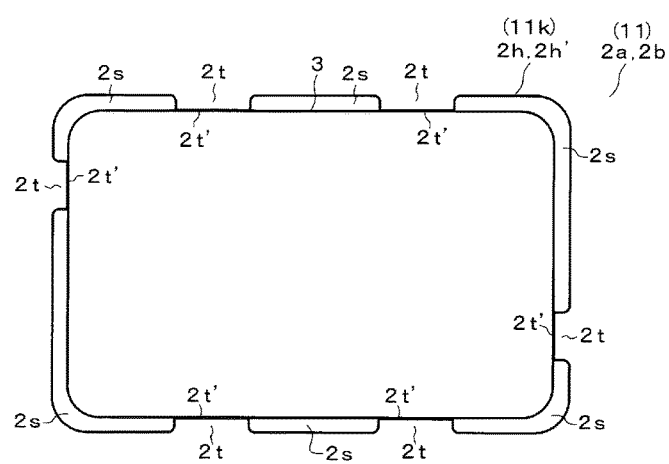
Figure 5C:
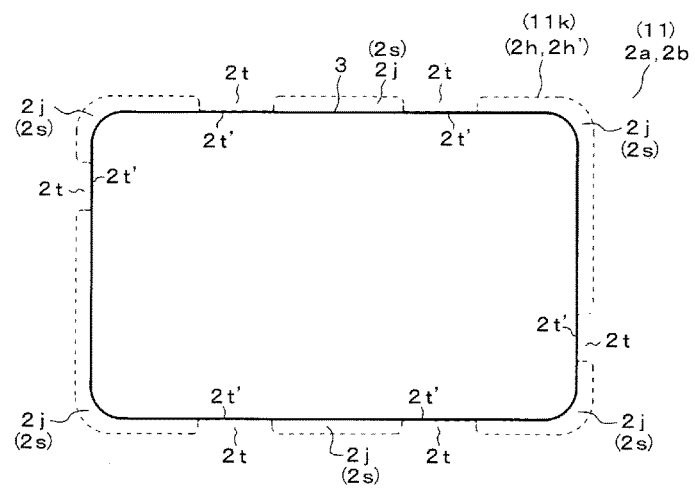

FIG. 1 is a diagram illustrating an upper surface layer L1 on an upper surface of the printed board 10. FIG. 2 is a diagram illustrating a cross section A-A in FIG. 1. FIG. 3 is a diagram illustrating internal layers L2, L3 and L4 inside of the printed board 10. FIG. 4 is a diagram illustrating a lower surface layer L5 on a lower surface of the printed board 10. FIGS. 5A to 5C are diagrams illustrating a recess portion 11k and a metal core 3 provided on the printed board 10.

FIG. 1 and FIG. 3 illustrate states seen from the upper side of the printed board 10, and FIG. 4 and FIGS. 5A to 5C illustrate states seen from the lower side of the printed board 10. In addition, in each diagram, only a part of the printed board 10 and the electronic apparatus 100 is illustrated for the sake of convenience.

The electronic apparatus 100 is configured with a DC-DC converter that is mounted in, for example, an electric vehicle or a hybrid-car. The electronic apparatus 100 includes the printed board 10, electronic components 9a to 9j, and a heat sink 4.

As illustrated in FIG. 2, the printed board 10 is a multi-layer board on which surface layers L1 and L5 are respectively provided on the upper surface and the lower surface thereof and a plurality of internal layers L2, L3, and L4 are provided inside thereof. As illustrated in FIG. 1 to FIG. 4, a base member 11, a metal core 3, wiring patterns 5a to 5w, and through-holes 6a to 6e are included in the printed board 10.

The base member 11 is formed of a first insulation layer 1 and a second insulation layer 2. The first insulation layer 1 is formed of a prepreg having high thermal conductivity. The prepreg having high thermal conductivity is a prepreg generated by, for example, mixing aluminum with epoxy, and has high thermal conductivity and insulation properties. The aluminum is an example of a reinforcement member and the epoxy is an example of a thermosetting resin.

The first insulation layer 1 is formed in a plane shape having a predetermined thickness (approximately 100 μm). On the upper surface of the first insulation layer 1 exposed to the outside, the upper surface layer L1 is provided. As illustrated in FIG. 1, electronic components 9a to 9g and the wiring patterns 5a to 5i are provided on the upper surface layer L1.

The wiring patterns 5a to 5i are formed of a copper foil having electro-conductivity and thermal conductivity. A part of the wiring patterns 5a to 5i functions as a land for soldering the electronic components 9a to 9g. The electronic components 9a to 9g are formed of field effect transistors (FET) 9a and 9b, discrete component 9c, and chip capacitors 9d to 9g.

The FETs 9a and 9b are surface-mount type electronic components having a high amount of heat generation. A source terminal s1 of the FET 9a is soldered on the wiring pattern 5a. A gate terminal g1 of the FET 9a is soldered on the wiring pattern 5b. A drain terminal d1 of the FET 9a is soldered on the wiring pattern 5c. A source terminal s2 of the FET 9b is soldered on the wiring pattern 5c. A gate terminal g2 of the FET 9b is soldered on the wiring pattern 5d. A drain terminal d2 of the FET 9b is soldered on the wiring pattern 5e.

As illustrated in FIG. 2, the discrete component 9c is an electronic component including lead terminals t1 and t2 (FIG. 1) that pass through the printed board 10. A main body portion of the discrete component 9c is mounted on the upper surface of the first insulation layer 1. Each lead terminal t1 and t2 of the discrete component 9c is respectively inserted into through-holes 6c and 6d, and then, is soldered.

The chip capacitors 9d to 9g are surface-mount type electronic components. As illustrated in FIG. 1, the chip capacitor 9d is soldered on the wiring patterns 5b and 5h. The chip capacitor 9e is soldered on the wiring patterns 5e and 5f. The chip capacitor 9f is soldered on the wiring patterns 5d and 5i. The chip capacitor 9g is soldered on the wiring patterns 5e and 5g.

As illustrated in FIG. 2, the second insulation layer 2 is provided on the lower surface of the first insulation layer 1. The second insulation layer 2 is formed in a plane shape of which the thickness is thicker than that of the first insulation layer 1, and has a laminated structure. More specifically, the second insulation layer 2 is formed by bonding copper-clad laminates 2a to both of the upper and lower surfaces of the usual prepreg 2b.

The usual prepreg 2b is a prepreg which can be a material for a general printed board, and is a plate member in which, for example, the epoxy is impregnated into glass fiber. The copper-clad laminate 2a is a plate in which the copper foil is pasted on both of the upper and the lower surface of the plate shaped core member 2c in which the epoxy is impregnated into glass fiber. The glass fiber and the epoxy that respectively forms the usual prepreg 2b and the copper-clad laminate 2a have different components from each other in the present example. However, in another example, the components thereof may be the same. The glass fiber is an example of the reinforcement member and the epoxy is an example of the thermosetting resin.

As another example, another reinforcement member such as a carbon fiber may be used instead of the glass fiber, and a pale member formed of a thermosetting resin other than the epoxy may be used as the second insulation layer 2.

The internal layer L2 is provided between the first insulation layer 1 and the second insulation layer 2 using a copper foil portion of each of the copper-clad laminates 2a of the second insulation layer 2, the internal layers L3 and L4 are provided inside of the second insulation layer 2, and the lower surface layer L5 is provided on the lower surface of the second insulation layer 2.

As illustrated in FIG. 3, wiring patterns 5j to 5n, 5j' to 5n', and 5j" to 5n" are provided in the internal layers L2 to L4. Each of the wiring patterns 5j to 5n, 5j' to 5n', and 5j" to 5n" are formed of the copper foil having electro-conductivity and thermal conductivity.

In the present example, the wiring patterns 5j, 5k, 5l, 5m, and 5n of the internal layer L2, the wiring patterns 5j', 5k', 5l', 5m', and 5n' of the internal layer L3, and the wiring patterns 5j", 5k", 5l", 5m", and 5n" of the internal layer L4 have the same shapes respectively. As another example, the shapes of the wiring patterns of each of the internal layers L2, L3, and L4 may be different from each other.

As illustrated in FIG. 4, electronic components 9h to 9j and wiring patterns 5o to 5w are provided on the lower surface layer L5. The wiring patterns 5o to 5w are formed of the copper foil having electro-conductivity and thermal conductivity. A part of the wiring patterns 5p, 5q, 5s, 5t, 5v, and 5w functions as a land for soldering the electronic components 9h to 9j.

The electronic components 9h to 9j are surface-mount type chip capacitors. The chip capacitor 9h is soldered on the wiring patterns 5p and 5q. The chip capacitor 9i is soldered on the wiring patterns 5t and 5s. The chip capacitor 9j is soldered on the wiring patterns 5v and 5w.

As illustrated in FIG. 2 and the like, the recess portion 11k is provided on the lower surface of the base member 11. Specifically, the recess portion 11k is provided on the second insulation layer 2 so as to reach the lower surface of the first insulation layer 1 while being recessed in the thickness direction from the lower surface of the second insulation layer 2. The metal core 3 is fitted into the recess portion 11k. The metal core 3 is also provided on the second insulation layer 2 so as to reach the lower surface of the first insulation layer 1 from the lower surface of the second insulation layer 2.

In addition, the metal core 3 is provided on the lower surface of the first insulation layer 1 so as to at least vertically overlap the FETs 9a and 9b. Specifically, as illustrated in FIG. 1, the metal core 3 is widely provided so as to overlap all or a part of a plurality of electronic components 9a, 9b, 9d, and 9f or a plurality of wiring patterns 5a to 5e, 5h, and 5i provided on the upper surface of the first insulation layer 1 seen from the upper side of the printed board 10.

The metal core 3 is formed of a metal plate such as copper having thermal conductivity. As illustrated in FIG. 1, FIG. 4, and FIGS. 5A to 5C, the metal core 3 is formed in a rectangular shape seen from the upper side or from the lower side. The recess portion 11k is formed in almost a rectangular shape seen from the upper side or from the lower side. An area of the recess portion 11k is larger than an area of the metal core 3.

As illustrated in FIG. 2, the upper surface of the metal core 3 is covered with the first insulation layer 1. The lower surface of the metal core 3 is exposed from the second insulation layer 2. The metal core 3 is an example of the "heat dissipation member" in one or more embodiments of the present invention.

The thermal conductivity of the first insulation layer 1 and the metal core 3 is higher than the thermal conductivity of the second insulation layer 2. In addition, the thermal conductivity of the metal core 3 is higher than the thermal conductivity of the first insulation layer 1. Specifically, for example, the thermal conductivity of the first insulation layer 1 is 3 W/mK to 5 W/mK (mK: meter Kelvin) while the thermal conductivity of the second insulation layer 2 is 0.3 W/mK to 0.5 W/mK. In addition, in a case where the metal core 3 is made from copper, the thermal conductivity of the metal core 3 is approximately 400 W/mK.

In each of the internal layers L2 to L4, an insulator (epoxy or glass fiber) of the second insulation layer 2 is interposed between the wiring patterns 5j to 5n, 5j' to 5n', and 5j'' to 5n'' and the metal core 3 (FIG. 2 and FIG. 3). For this reason, the metal core 3 is insulated from the wiring patterns 5j to 5n, 5j' to 5n', and 5j'' to 5n'' respectively.

On the lower surface layer L5, a predetermined insulation distance is provided between the metal core 3 and the wiring patterns 5o, 5p, 5r, 5s, and 5u provided in the vicinity of the metal core 3 (FIG. 2 and FIG. 4). Therefore, the metal core 3 and each of the wiring patterns 5o to 5w are insulated.

In the upper surface layer L1, the first insulation layer 1 is interposed between the metal core 3 and the wiring patterns 5a to 5e, 5h, and 5i provided immediately above the metal core 3 (FIG. 1 and FIG. 2). In other words, the wiring patterns 5a to 5e, 5h, and 5i are provided on the upper side of the metal core 3 via the first insulation layer 1. For this reason, the metal core 3 and the wiring patterns 5a to 5e, 5h, and 5i are insulated from each other. In addition, the wiring patterns 5a, 5e, 5f, 5g, 5i, and 5h are provided on the upper side of the second insulation layer 2 via the first insulation layer 1. For this reason, the wiring patterns 5j to 5n in the internal layer L2 and the wiring patterns 5a, 5e, 5f, 5g, 5i, and 5h on the upper surface layer L1 are insulated from each other. The first insulation layer 1 is an example of the "insulator" in one or more embodiments of the present invention.

The through-holes 6a to 6e pass through the first insulation layer 1, the second insulation layer 2, and the wiring patterns provided on both of the insulation layers 1 and 2 (FIG. 2). On the inner surface of each through-hole 6a to 6e, the copper or the solder plating is applied. The through-holes 6a to 6e connect the wiring patterns on other layers L1 to L5.

Specifically, a plurality of through-holes 6a is provided so as to pass through the wiring pattern 5a on the insulation layers 1 and 2 and the upper surface layer L1, the wiring patterns 5j, 5j', and 5j'' on the internal layers L2 to L4, and the wiring pattern 5o on the lower surface layer L5. Each through-hole 6a connects the wiring patterns 5a, 5j, 5j', 5j'', and 5o.

A plurality of through-holes 6b is provided so as to pass through the insulation layers 1 and 2, the wiring pattern 5e on the upper surface layer L1, the wiring patterns 5m, 5m', and 5m'' on the internal layers L2 to L4, and the wiring pattern 5s on the lower surface layer L5. Each through-hole 6b connects the wiring patterns 5e, 5m, 5m', 5m'', and 5s.

The through-hole 6c is provided so as to pass through the insulation layers 1 and 2, the wiring pattern 5e on the upper surface layer L1, the wiring patterns 5m, 5m', and 5m'' on the internal layers L2 to L4, and the wiring pattern 5s on the lower surface layer L5. One lead terminal t1 of the discrete component 9c is soldered to the through-hole 6c, and thus, the lead terminal t1 and the wiring patterns 5e, 5m, 5m', 5m'', and 5s are connected to each other via the through-hole 6c.

The through-hole 6d is provided so as to pass through the insulation layers 1 and 2, the wiring pattern 5f on the upper surface layer L1, the wiring patterns 5n,5n', and 5n'' on the internal layers L2 to L4, and the wiring pattern 5r on the lower surface layer L5. Another lead terminal t2 of the discrete component 9c is soldered to the through-hole 6d, and thus, the lead terminal t2 and the wiring patterns 5f, 5n, 5n', 5n'', and 5r are connected to each other via the through-hole 6d.

The through-hole 6e is provided so as to pass through the insulation layers 1 and 2, the wiring pattern 5h on the upper surface layer L1, the wiring patterns 5k,5k', and 5k'' on the internal layer L2 to L4, and the wiring pattern 5p on the lower surface layer L5. The through-hole 6e connects the wiring patterns 5h, 5k, 5k', 5k'', and 5p.

As illustrated in FIG. 2, the heat sink 4 is provided on the lower side of the second insulation layer 2 and the metal core 3. The heat sink 4 is made from a metal such as aluminum, and dissipates the heat generated in the printed board 10 to the outside and cools the printed board 10. The heat sink 4 is an example of an "external heat dissipation body" in one or more embodiments of the present invention.

Protruding portions 4a and 4b protruding to the upper side is formed on the upper surface of the heat sink 4. The upper surface of the protruding portions 4a and 4b is parallel to the plate surface of the printed board 10.

A screw hole 4h is formed on the protruding portion 4b of the heat sink 4 in the thickness direction of the printed board 10 (the vertical direction in FIG. 2). In each of the insulation layers 1 and 2, a through-hole 7 is provided on a position where the electronic components 9a to 9j do not overlap the wiring patterns 5a to 5w. The through-hole 7 is in communication with the screw hole 4h of the heat sink 4.

As illustrated in FIG. 2, the protruding portion 4b of the heat sink 4 is fixed to the lower surface of the second insulation layer 2 by causing a screw 8 to pass through the through-hole 7 from the upper side of the first insulation layer 1 and to be screwed into the screw hole 4h of the heat sink 4. By providing a plurality of screwing places described above, the heat sink 4 can be mounted on the lower side of the printed board 10.

In a state in which the protruding portion 4b of the heat sink 4 is fixed on the lower surface of the second insulation layer 2, the lower surface of the metal core 3 is in contact with the upper surface of the protruding portion 4a of the heat sink 4. In the present example, the area of the upper surface of the protruding portion 4a of the heat sink 4 is made to be slightly smaller than the area of the lower surface of the metal core 3 in order to secure the predetermined insulation distance between the wiring patterns 5o, 5p, 5r, 5s, and 5u on the lower surface layer L5 and the metal core 3.

As another example, considering the arrangement of the wiring patterns on the lower surface layer L5 and the electronic components, the area of the upper surface of the protruding portion 4a of the heat sink 4 may be the same or may be slightly larger than the area of the lower surface of the metal core 3.

Thermal grease (not illustrated) having high thermal conductivity is applied on the upper surface of the protruding portion 4a of the heat sink 4. In this way, the adhesion between the upper surface of the protruding portion 4a and the lower surface of the metal core 3 can be improved, and thus, the thermal conductivity from the metal core 3 to the heat sink 4 can be improved.

Next, a method for manufacturing the printed board 10 will be described with reference to FIG. 1, FIGS. 5A to 5C, FIG. 6A and FIG. 6B.

Figure 6B:
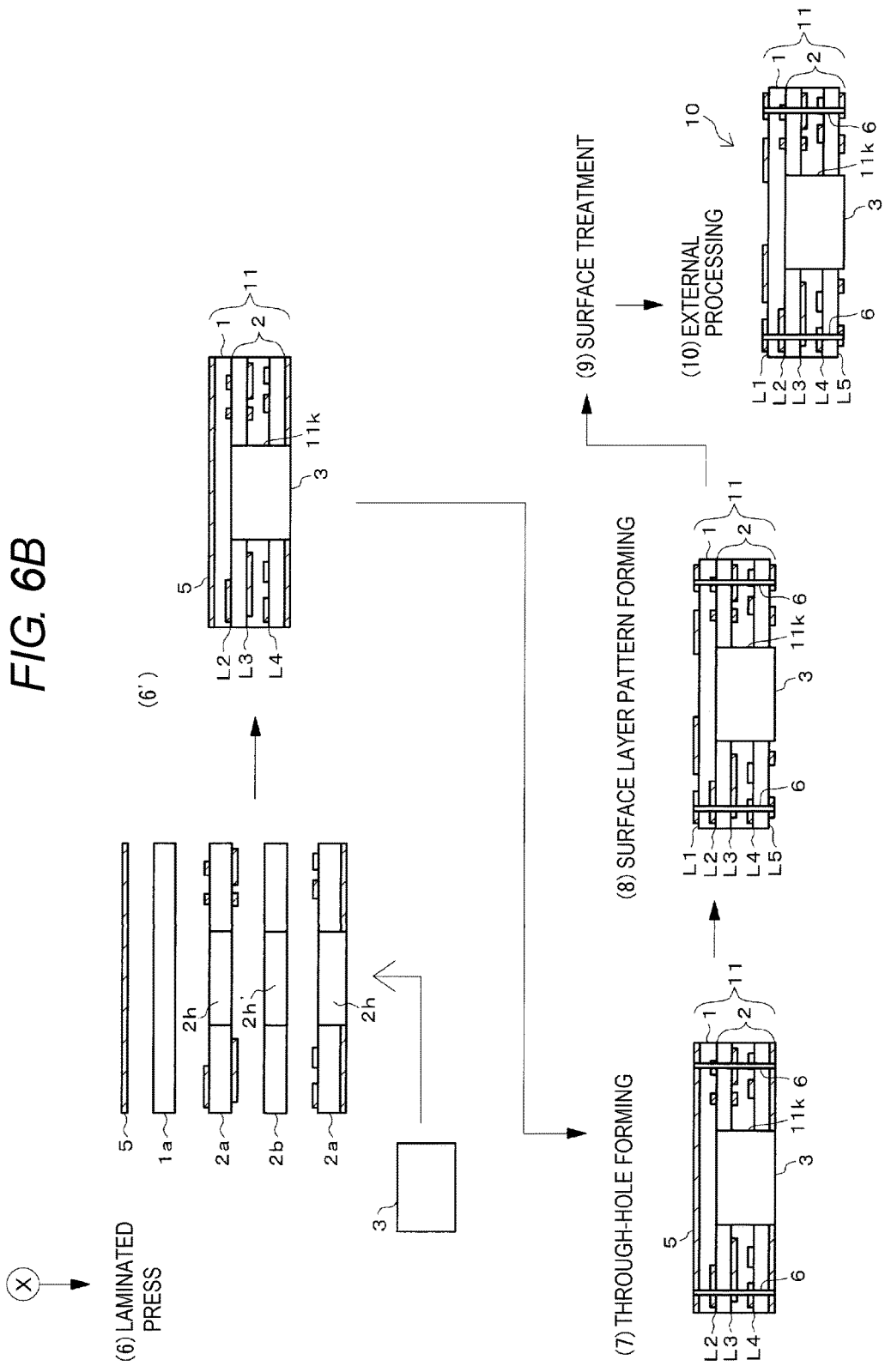
FIG. 6B is a diagram illustrating the continuation of the manufacturing process in FIG. 6A.

FIG. 6A and FIG. 6B are diagrams illustrating a manufacturing process of the printed board 10. In FIG. 6A and FIG. 6B, for the sake of convenience, each portion of the printed board 10 is illustrated in a simplified manner.

In FIG. 6A, an etching process or the like is performed on the copper foil provided on both the upper and lower sides surfaces of one copper-clad laminate 2a among the two copper-clad laminates 2a, and then, the wiring patterns 5j to 5n and 5j' to 5n' (the reference signs are omitted in FIG. 6A and FIG. 6B) of the internal layers L2 and L3 are formed. In addition, an etching process or the like is performed on the copper foil on the upper side surfaces of another copper-clad laminate 2a, and then, the wiring patterns 5j'" to 5n'" (the reference signs are omitted in FIG. 6A and FIG. 6B) of the internal layer L4 are formed ((1) of FIG. 6A).

Next, the through-hole 2h for fitting the metal core 3 into the copper-clad laminate 2a is formed ((2) of FIG. 6A). In addition, in the usual prepreg 2b, the through-hole 2h' to be fitted into the metal core 3 is formed ((3) of FIG. 6A). As described below, the inner circumferential surfaces of the through-holes 2h and 2h' configure the inner circumferential surface of the recess portion 11k.

The through-holes 2h and 2h' are formed in a substantially rectangular shape seen from the thickness direction of the copper-clad laminate 2a or the usual prepreg 2b as illustrated in FIG. 5A. On the inner circumferential surface of the through-holes 2h and 2h', a plurality of protruding portions 2t are formed in a constant interval toward the inner side. A protrusion length of each protruding portion 2t is long so as to reach the outer circumferential surface of the metal core 3 in a state in which the metal core 3 is fitted into the through-holes 2h and 2h' as illustrated in FIG. 5B.

In this way, in a state in which the metal core 3 is fitted into the through-holes 2h and 2h', the contact portion 2t' (a distal end portion of the protruding portion 2t) on which the outer circumferential surface of the metal core 3 and the inner circumferential surfaces of the through-holes 2h and 2h' are in contact with other and the separation portion 2s (the portion where there is no protruding portion 2t) on which the outer circumferential surface of the metal core 3 and the inner circumferential surfaces of the through-holes 2h and 2h' are not in contact with other are formed. Here, a plurality of contact portions 2t' and the separation portion 2s are alternately formed in a constant interval respectively in the circumferential direction of the metal core 3 and the through-holes 2h and 2h'.

For this reason, a contact area between the metal core 3 and the inner circumferential surfaces of the through-holes 2h and 2h' becomes small, and thus, it is possible for the metal core 3 to be easily fitted into the through-holes 2h and 2h'. Evidently, when the metal core 3 is once fitted into the through-holes 2h and 2h', it is possible to make it difficult for the metal core 3 to escape from the through-holes 2h and 2h' due to the frictional resistance between each contact portion 2t' which is in contact with the inner circumferential surfaces of the through-holes 2h and 2h' and the outer circumferential surface of the metal core 3.

In addition, the prepreg 1a having high thermal conductivity and a predetermined thickness and a copper foil 5 to be pasted on the upper surface of the prepreg 1a having a predetermined thickness are prepared ((4) of FIG. 6A). Furthermore, the metal core 3 having a predetermined shape is formed after processing a metal plate such as copper ((5) of FIG. 6A).

Then, one copper-clad laminate 2a, the usual prepreg 2b, another copper-clad laminate 2a, the prepreg 1a having high thermal conductivity, and the copper foil 5 are stacked in this order from the bottom, and the metal core 3 is fitted into the through-holes 2h and 2h'. Then, the stacked members are vertically pressed (in the thickness direction of each member) while being heated ((6) of FIG. 6B).

In this way, the epoxy on the prepregs 2b and 1a and the copper-clad laminate 2a is melted and enters the gaps between the members 1a, 2a, and 2b. Then, by curing the epoxy, the members 1a, 2a, and 2b are bonded and then, the first insulation layer 1, the second insulation layer 2, the internal layers L2 to L4, and the recess portion 11k of the base member 11 are configured ((6' of FIG. 6B). The inner circumferential surface of the recess portion 11k is formed from the inner circumferential surfaces of the through-holes 2h and 2h', and the bottom surface of the recess portion 11k is formed from the lower surface of the prepreg 1a having high thermal conductivity.

In addition, the gap between the metal core 3 and the recess portion 11k and the separation portion 2s is filled with the epoxy melted from each of the prepregs 2b and 1a and the copper-clad laminate 2a. Then, by curing the epoxy, the base member 11 and the metal core 3 are integrated. That is, the upper surface of the metal core 3 is held on the first insulation layer 1. The metal core 3 is held by the glass fiber of the copper-clad laminate 2a or the prepreg 2b and the epoxy on the contact portion 2t' between the metal core 3 and the recess portion 11k. In addition, the metal core 3 is held on the separation portion 2s between the metal core 3 and the recess portion 11k by the copper-clad laminate 2a or the cured epoxy 2j of the prepreg 2b (FIG. 5C).

Figure 7A:
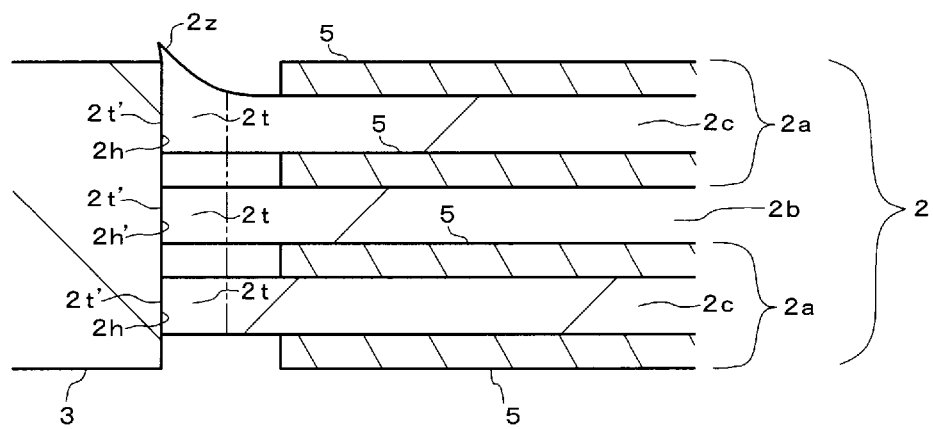
FIGS. 7A and 7B are diagrams illustrating an example of a burr generated on a contact portion in the manufacturing process of the printed board in FIG. 1.
Figure 7B:
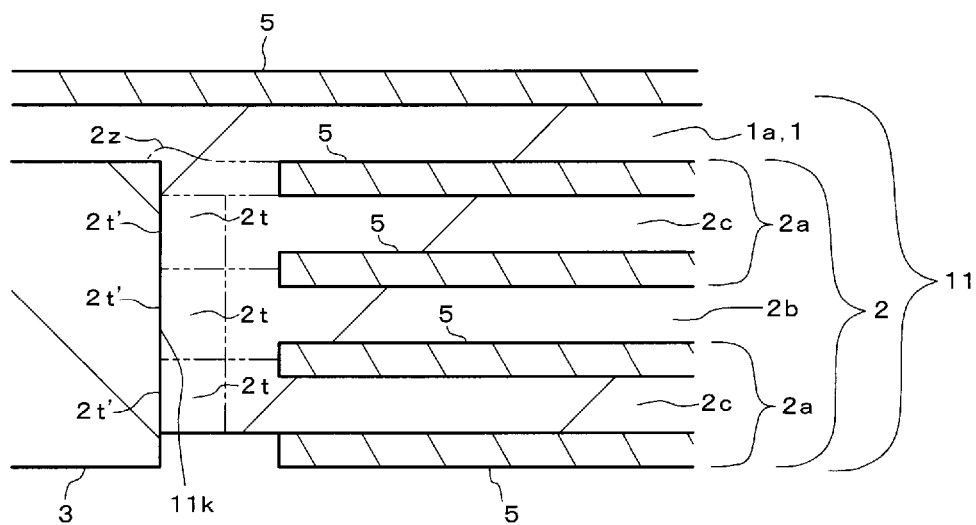

FIGS. 7A and 7B are diagrams illustrating an example of a burr 2z generated on a contact portion 2t' in the manufacturing process of the printed board 10. For example, when the through-hole 2h is formed on the copper-clad laminate 2a on the upper side ((2) in FIG. 6A) or when the metal core 3 is fitted into the through-hole 2h ((6) in FIG. 6B), as illustrated in FIG. 7A, there is a concern that the burr 2z of the core member 2c is generated on the end portion of the protruding portion 2t of the through-hole 2h, that is, on the edge of the contact portion 2t' so as to protrude to the upper side. Then, as described above, if the stacked body of each member 5, 1a, 2a, 2b, and 3 is integrated by being heated and pressed, a part of the burr 2z can ride on the metal core 3. In this case, as illustrated in FIG. 7B, the burr 2z remains on the boundary portion of the metal core 3 and the second insulation layer 2 in a mountain shape, and thus, the residual stress is generated around the burr 2z.

Figure 8A:
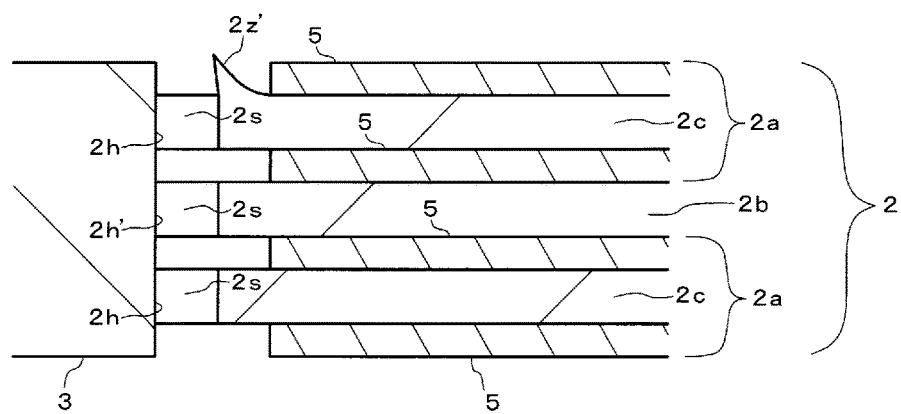
FIGS. 8A and 8B are diagrams illustrating an example of a burr generated on a separation portion in the manufacturing process of the printed board in FIG. 1.
Figure 8B:
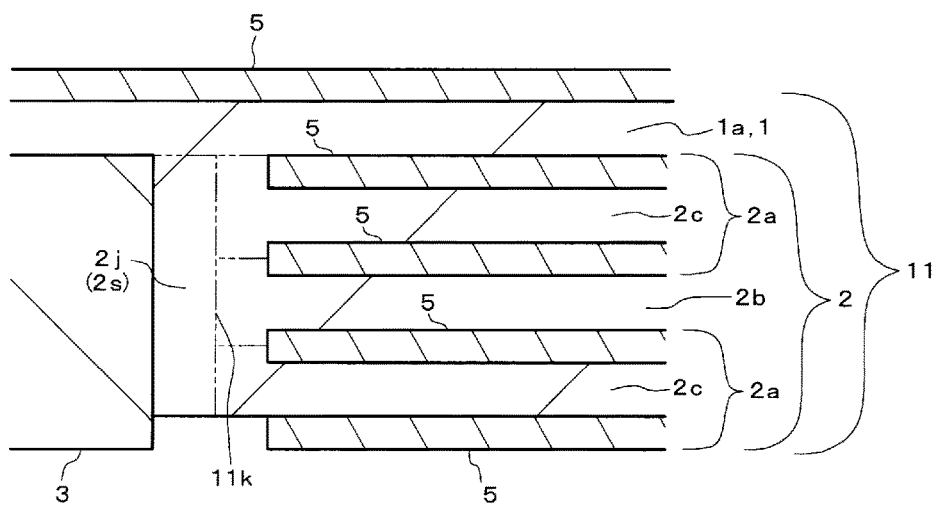

FIGS. 8A and 8B are diagrams illustrating an example of the burr 2z' generated on the separation portion 2s in the manufacturing process of the printed board 10. When the through-hole 2h is formed on the copper-clad laminate 2a on the upper side, as illustrated in FIG. 8A, there is a concern that the burr 2z' of the core member 2c is generated between the protruding portion 2t adjacent to the through-hole 2h, that is, on the edge of the separation portion 2s so as to protrude to the upper side. However, in this case, as described above, if the stacked body of each member 5, 1a, 2a, 2b, and 3 is integrated by being heated and pressed, the burr 2z' is eliminated by being buried in the epoxy that fills the separation portion 2s (FIG. 8B). For this reason, the residual stress on the boundary portion between the metal core 3 and the second insulation layer 2 due to the burr 2z' is not generated.

In FIG. 6B, as described above, after the stacked body of each member 5, 1a, 2a, 2b, and 3 is integrated, the through-holes are opened on the predetermined positions on the copper foil 5 and the base member 11, the plating is applied on the inner surfaces of the through-holes, and then, the through-holes 6a to 6e (a portion of reference numerals 6 in FIG. 6B) are formed ((7) in FIG. 6B). Next, by performing the etching processing on the copper foil provided on the lowermost portion, the wiring patterns 5o to 5w (referenced numerals are omitted in FIG. 6B) of the lower surface layer L5 are formed on the lower surface of the second insulation layer 2. In addition, by performing the etching processing on the copper foil 5 provided on the uppermost portion, the wiring patterns 5a to 5i (signs are omitted in FIG. 6B) of the upper surface layer L1 are formed on the upper surface of the first insulation layer 1 ((8) of FIG. 6B).

In this case, as illustrated in FIG. 1, on the upper surface layer L1, the entire portions in the width direction of the wiring patterns 5a, 5e, 5h, and 5i provided on the boundary portion of the metal core 3 and the second insulation layer 2 are provided so as to pass through the position vertically overlapping the separation portion 2s without passing through the position vertically overlapping the contact portion 2t'. Specifically, the wiring patterns 5a, 5e, 5h, and 5i are provided on the upper surface layer L1 such that the entire portions in the width direction of the wiring patterns 5a, 5e, 5h, and 5i reach the position vertically overlapping the metal core 3 while passing through from the position not vertically overlapping the metal core 3 to the position vertically overlapping the separation portion 2s.

Next, the surface treatment such as a resist or a silk is applied to the exposed upper surface of the first insulation layer 1, the wiring patterns 5a to 5i, the lower surface of the second insulation layer 2, the wiring patterns 5o to 5w, and the like ((9) of FIG. 6B). Then, by cutting the extra portions of the end portions of each insulation layer 1 and 2, the external shape is processed ((10) in FIG. 6B). As described above, the printed board 10 is formed.

According to the embodiment described above, in a state in which the metal core 3 is fitted into the recess portion 11k provided on the base member 11 of the printed board 10, the contact portions 2t' which are in contact with each other and the separation portions 2s which are not in contact with each other are formed between the inner circumferential surface of the recess portion 11k and the outer circumferential surface of the metal core 3. Then, the wiring patterns 5a, 5e, 5h, and 5i on the upper surface layer L1 are provided so as to pass through the position overlapping the separation portion 2s while not passing through the position overlapping the contact portion 2t'.

For this reason, even if there is a concern that the burr 2z of the core member 2c is generated on the contact portion 2t' (FIG. 7B) and the residual stress is generated around the burr 2z, the wiring patterns 5a, 5e, 5h, and 5i are not present on the position of the contact portion 2t'. Therefore, the wiring patterns are not affected by the residual stress. On the other hand, the burr of the core member 2c is not generated on the separation portion 2s (FIG. 8B), and thus, the residual stress due to the burr is not generated either. Accordingly, even when the wiring patterns 5a, 5e, 5h, and 5i are present on the position of the separation portion 2s, the wiring patterns are not affected by the residual stress. In this way, on the upper side of the boundary portion between the metal core 3 and the second insulation layer 2, it is possible to prevent the wiring patterns 5a, 5e, 5h, and 5i from being disconnected due to the residual stress caused by the burr of the core member 2c.

In addition, in the embodiment described above, the wiring patterns 5a, 5e, 5h, and 5i are provided on the upper surface layer L1 so as to reach the position not vertically overlapping the metal core 3 from the position vertically overlapping the metal core 3 through the position where the entire portions in the width direction of the wiring patterns 5a, 5e, 5h, and 5i are vertically overlapping the separation portion 2s. Therefore, on the upper side of the boundary portion between the metal core 3 and the second insulation layer 2, it is possible to prevent the wiring patterns 5a, 5e, 5h, and 5i from being disconnected due to the residual stress caused by the burr of the core member 2c, and it is possible to prevent a part of the wiring patterns 5a, 5e, 5h, and 5i from being damaged. Thus, it is possible to maintain the high electrical reliability of the wiring patterns 5a, 5e, 5h, and 5i.

In addition, in the embodiment described above, a plurality of contact portions 2t' and the separation portions 2s are alternately provided in the circumferential directions of the recess portion 11k and the metal core 3 in the predetermined gap respectively. Therefore, when the metal core 3 is fitted into the recess portion 11k, due to the frictional resistance between each contact portion 2t' to the inner circumferential surface of the recess portion 11k and the outer circumferential surface of the metal core 3, it becomes difficult for the metal core 3 to escape from the recess portion 11k. Therefore, it becomes easy to integrate the base member 11 and the metal core 3 by heating and pressing the stacked body of each member 5, 1a, 2a, 2b, and 3, and thus, it is possible to easily manufacture the printed board 10.

In addition, in the embodiment described above, at the time of forming the through-holes 2h and 2h' on the copper-clad laminate 2a or on the prepreg 2b of the base member 11, by providing a plurality of protruding portions 2t on the inner circumferential surfaces of the through-holes 2h and 2h', it is possible to easily provide a plurality of contact portions 2t' and the separation portions 2s between the recess portion 11k and the metal core 3. In addition, it is not necessary to perform complicated processing on the outer circumferential surface of the metal core 3. Therefore, it is possible to easily form the metal core 3.

In addition, in the embodiment described above, the base member 11 is formed from the first insulation layer 1 and the second insulation layer 2 having thermal conductivity lower than the first insulation layer 1, and the recess portion 11k and the metal core 3 are provided on the second insulation layer 2 so as to reach the lower surface of the first insulation layer 1 from the lower surface of the second insulation layer 2. Therefore, the position of the metal core 3 with respect to the thickness direction of the base member 11 can easily be determined without the recess portion 11k passing through the base member 11, and thus, it is possible to easily manufacture the printed board 10. In addition, since the upper surface of the metal core 3 is in contact with the lower surface of the first insulation layer 1, the heat generated in the electronic components 9a, 9b, 9d, and 9f mounted on the upper surface of the first insulation layer 1 can easily be transferred to the metal core 3 through the first insulation layer 1, and thus, it is possible to efficiently dissipate the heat.

Furthermore, in the embodiment described above, the recess portion 11k is provided so as to be recessed in the thickness direction from the lower surface of the printed board 10, the metal core 3 is exposed from the lower surface of the printed board 10, and the heat sink 4 is mounted on the lower side of the printed board 10 so as to be in contact with the exposed surface of the metal core 3. Therefore, the heat generated in the electronic components 9a, 9b, 9d, and 9f mounted on the upper surface of the printed board 10 or the heat transferred to the printed board 10 can be transferred to the heat sink 4 from the metal core 3, and thus, it is possible to efficiently dissipate the heat to the outside.

Figure 9:
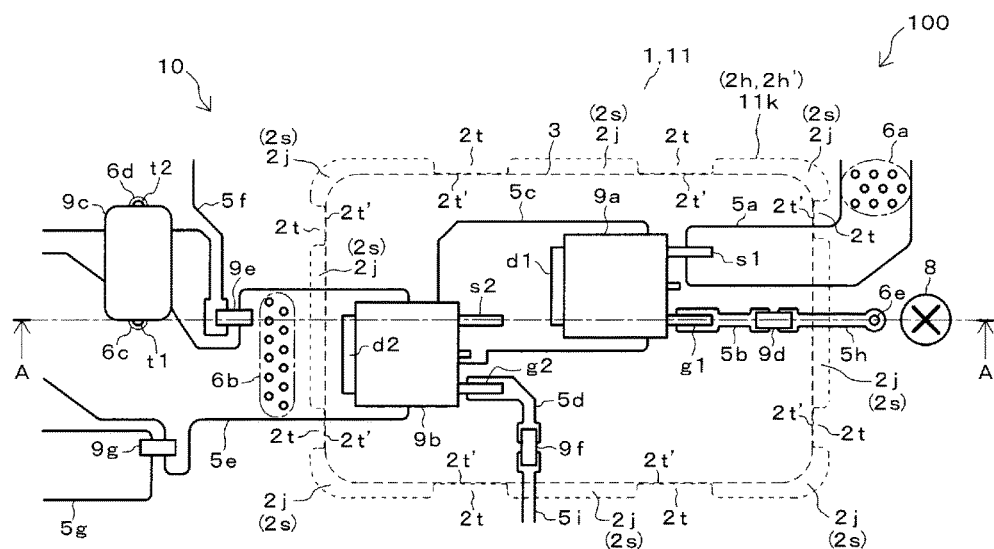
FIG. 9 is a diagram illustrating another embodiment in the present invention.

In the present invention, various embodiments can be adopted other than the embodiment described above. For example, in the embodiment described above, an example is described, in which the wiring patterns 5a, 5e, 5h, and 5i on the upper side of the boundary portion between the metal core 3 and the second insulation layer 2 are provided on the upper surface layer L1 such that the entire portions in the width direction of the wiring patterns pass through the position vertically overlapping the separation portion 2s. However, the present invention is not limited only to the above description. Besides this, for example, as illustrated in FIG. 9, the wiring patterns 5a and 5e on the upper side of the boundary portion between the metal core 3 and the second insulation layer 2 may be provided on the upper surface layer L1 such that the entire portion in the width direction of the wiring patterns do not pass through the position vertically overlapping the contact portion 2t' but at least a partial portion in the width direction of the wiring patterns pass through the position vertically overlapping the separation portion 2s. Here, almost entire portion in the width direction of the wide wiring patterns 5a and 5e are provided on the upper surface layer L1 so as to pass through the position vertically overlapping the separation portion 2s.

In this way, in the boundary portion between the metal core 3 and the second insulation layer 2, even though the burr of the core member 2c riding on the metal core 3 is generated on the contact portion 2t', and the residual stress is generated around the burr, the burr of the core member 2c riding on the metal core 3 is not generated on the separation portion 2s, and thus, the residual stress is not generated due to the burr. Therefore, on the upper side of the boundary portion between the metal core 3 and the second insulation layer 2, even though the partial portions of the wiring patterns 5a and 5e are damaged by the residual stress due to the burr of the core member 2c, it is possible to prevent a complete disconnection.

Figure 10:
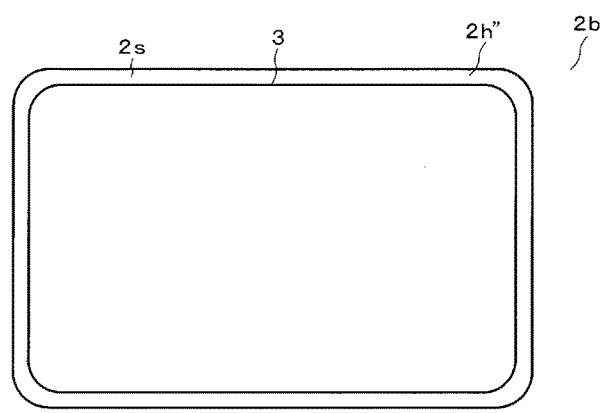
FIG. 10 is a diagram illustrating still another embodiment in the present invention.

In addition, in the embodiment described above, an example is described, in which the protruding portions 2t are respectively formed on the copper-clad laminate 2a that configures the recess portion 11k and on the inner circumferential surface of the through-holes 2h and 2h' of the prepreg 2b. However, the present invention is not limited only to this. Besides this, for example, the protruding portions 2t illustrated in FIGS. 5A to 5C may be formed only on the inner circumferential surface of the through-hole 2h of the copper-clad laminate 2a, and as illustrated in FIG. 10, in the usual prepreg 2b, the through-hole 2h" that does not have a recess portion or a protruding portion on the inner circumferential surface may be formed.

Figure 11:
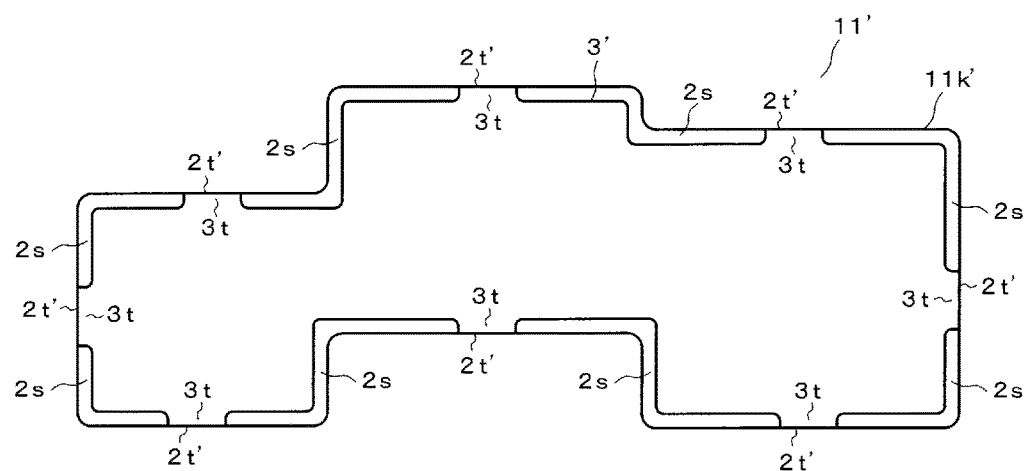
FIG. 11 is a diagram illustrating still another embodiment in the present invention.

In addition, in the embodiment described above, an example is described, in which the shape of the metal core 3 seen from the upper side or the lower side is a rectangular shape. However, not being limited to this, the shape of the metal core seen from the upper side may be any shape according to the arrangement or the shape of the electronic components on the printed board. For example, as illustrated in FIG. 11, a metal core 3' may be formed in a shape irregularly having a plurality of angles and sides seen from the upper side. In this case, a recess portion 11k' of a base member 11' may also be formed to have a shape irregularly having a plurality of angles and sides seen from the upper side, and the size thereof may be larger than the outer diameter of the metal core 3'. In addition, as illustrated in FIG. 11, by providing a plurality of protruding portions 3t on only the outer circumferential surface of the metal core 3' in a predetermined interval, the contact portion 2t' and the separation portion 2s may be provided between the metal core 3' outer circumferential surface, and the inner circumferential surface of the recess portion 11k'.

In addition, by providing the protruding portions on both of the outer circumferential surface of the metal core and the inner circumferential surface of the recess portion, the portion where the protruding portions contact may be the contact portion and a portion other than the protruding portions may be the separation portion.

Figure 12:
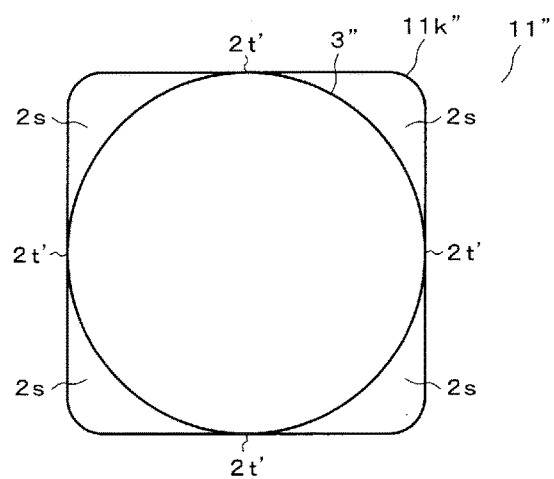
FIG. 12 is a diagram illustrating still another embodiment in the present invention.
Figure 13A:
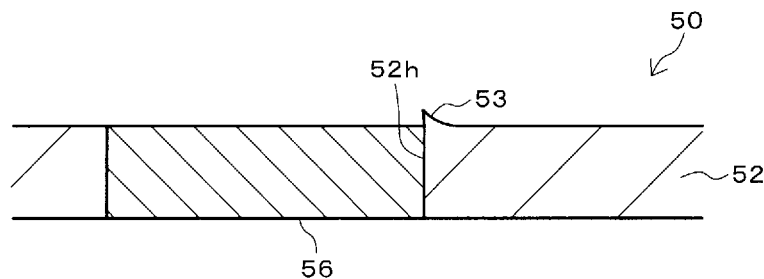
FIGS. 13A to 13C are diagrams for describing an object of embodiments of the present invention.
Figure 13B:
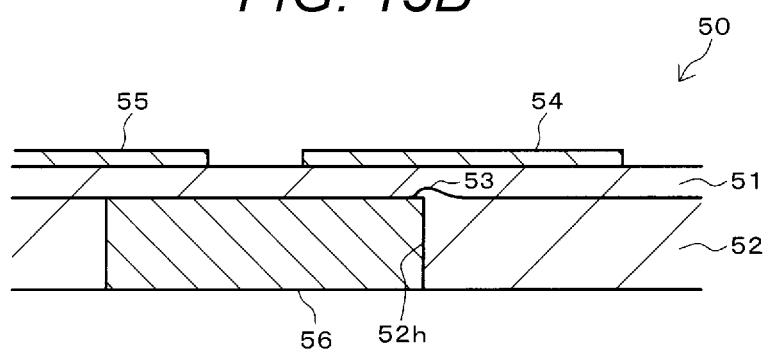
Figure 13C:
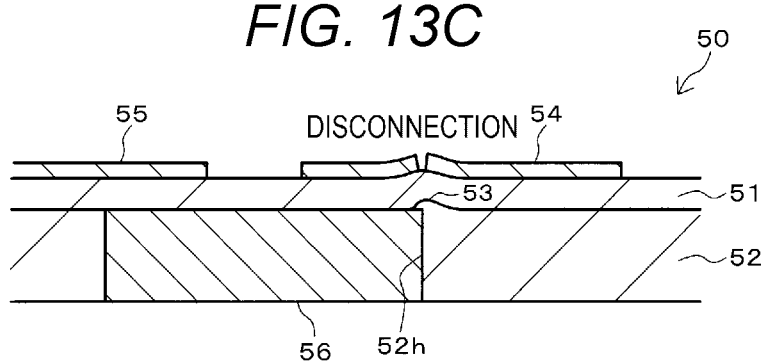

Furthermore, as illustrated in FIG. 12, a metal core 3" may be formed in a cylindrical shape such that the outer circumferential surface of the metal core 3" becomes a curved surface, and then, a recess portion 11k" of a base member 11" may be formed in a rectangular shape seen from the upper side such that the metal core 3" can be fitted. In this case, even if a recess portion or a protruding portion is not provided on the outer circumferential surface of the metal core 3" and the inner circumferential surface of the recess portion 11k", if the inner width of the recess portion 11k" is formed to be the same as the diameter of the metal core 3", it is possible to form the contact portion 2t' where the outer circumferential surface of the metal core 3" and the inner circumferential surface of the recess portion 11k" are in contact with each other and the separation portion 2s where those are not in contact with each other.

In addition, in the embodiment described above, an example is described, in which the heat sink 4 is used as the external heat dissipation body. However, instead of this, an air-cooled or water cooled radiator, or a radiator using coolant may be used. In addition, not only the metal-based external heat dissipation body but also the external heat dissipation body formed from a resin having a high thermal conductivity may be used.

In addition, in the embodiment described above, an example is described, in which the present invention is applied to the printed board 10 on which two surface layers L1 and L5 and three internal layers L2 to L4 are provided. However, the present invention can also be applied to a single layer printed board on which a conductor such as a wiring pattern is provided on only the upper surface, or to a printed board on which conductors are provided on equal to or more than two layers.

Furthermore, in the embodiment described above, an example is described, in which the DC-DC converter mounted in the electric vehicle or the hybrid car is exemplified as the electronic apparatus 100. However, the present invention can be applied to another electronic apparatus including a printed board, heat generating electronic components, and a heat dissipation body.

While the invention has been described with respect to a limited number of embodiments, those skilled in the art, having benefit of this disclosure, will appreciate that other embodiments can be devised which do not depart from the scope of the invention as disclosed herein. According, the scope of the invention should be limited only by the attached claims.

The invention claimed is:

1. A printed board comprising:
a base member comprising a reinforcement member and a thermosetting resin, and formed in a plate shape;
a recess portion provided on a lower surface of the base member;
a heat dissipation member fitted into the recess portion; and
a wiring pattern provided on an upper side of the base member and the heat dissipation member via an insulator,
wherein a contact portion in which an inner circumferential surface of the recess portion and an outer circumferential surface of the heat dissipation member are in contact with each other and a separation portion in which the inner circumferential surface of the recess portion and the outer circumferential surface of the heat dissipation member are not in contact with each other are formed in a state in which the heat dissipation member is fitted into the recess portion,
wherein the separation portion includes a gap between the recess portion and the heat dissipation member that is filled with the thermosetting resin of the base member, and
wherein the wiring pattern is provided such that at least a partial portion in a first direction of the wiring pattern passes through a position vertically overlapping the separation portion while an entire portion in the first direction of the wiring pattern does not pass through a position vertically overlapping the contact portion.

2. The printed board according to claim 1,
wherein the contact portion is a plurality of contact portions and the separation portion is a plurality of separation portions, the plurality of contact portions and separation portions are respectively and alternately provided in a predetermined interval in a circumferential direction of the recess portion and the heat dissipation member.

3. The printed board according to claim 1,
wherein the contact portion is formed by a protruding portion formed on the inner circumferential surface of the recess portion, and
wherein the separation portion is formed by a portion other than the protruding portion on the inner circumferential surface of the recess portion.

4. The printed board according to claim 1,
wherein the base member comprises:
a first insulation layer comprising the insulator on which the wiring pattern is provided on the upper surface of the base member, and
a second insulation layer provided on a lower surface of the first insulation layer,
wherein the inner circumferential surface of the recess portion is formed by an inner circumferential surface of a through-hole formed in the second insulation layer,
wherein a bottom surface of the recess portion is formed by the lower surface of the first insulation layer, and
wherein the wiring pattern reaches a position vertically overlapping the heat dissipation member from a position not vertically overlapping the heat dissipation member through the position where at least a partial portion in the first direction of the wiring pattern vertically overlaps the separation portion.

5. The printed board according to claim 1,
wherein the wiring pattern is provided such that the entire portion in the first direction of the wiring pattern passes through the position vertically overlapping the separation portion.

6. An electronic apparatus comprising:
the printed board according to claim 1; and
an electronic component mounted on the printed board on the position vertically overlapping the heat dissipation member.

7. The electronic apparatus according to claim 6,
wherein the heat dissipation member is exposed from a lower surface of the printed board, and
wherein the electronic apparatus further comprises an external heat dissipation body provided on a lower side of the printed board so as to be in contact with an exposed surface of the heat dissipation member.

* * * * *